US012656801B2

(12) United States Patent
Choi et al.

(10) Patent No.: US 12,656,801 B2
(45) Date of Patent: Jun. 16, 2026

(54) LOW DROPOUT REGULATORS

(71) Applicant: SAMSUNG ELECTRONICS CO., LTD., Suwon-si (KR)

(72) Inventors: Junhan Choi, Suwon-si (KR); Jaewoo Park, Suwon-si (KR); Myoungbo Kwak, Suwon-si (KR); Jinook Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 132 days.

(21) Appl. No.: 18/806,082

(22) Filed: Aug. 15, 2024

(65) Prior Publication Data

US 2025/0060771 A1 Feb. 20, 2025

(30) Foreign Application Priority Data

Aug. 18, 2023 (KR) ........................ 10-2023-0108540
Oct. 24, 2023 (KR) ........................ 10-2023-0143253

(51) Int. Cl.
*G05F 1/59* (2006.01)
*G11C 5/14* (2006.01)

(52) U.S. Cl.
CPC ................ *G05F 1/59* (2013.01); *G11C 5/147* (2013.01)

(58) Field of Classification Search
CPC ............ G05F 1/59; G05F 1/575; G11C 5/147
USPC ........................................................ 365/226
See application file for complete search history.

(56) References Cited

U.S. PATENT DOCUMENTS

| | | | |
|---|---|---|---|
| 5,675,241 | A | 10/1997 | Teggatz et al. |
| 7,893,670 | B2 | 2/2011 | Pulijala et al. |
| 9,018,924 | B2 | 4/2015 | Vemula et al. |
| 10,591,938 | B1 | 3/2020 | Glora |
| 2019/0302820 | A1* | 10/2019 | Yasusaka ................ G05F 1/575 |
| 2022/0383925 | A1 | 12/2022 | Ramanan et al. |
| 2023/0045744 | A1 | 2/2023 | Jung et al. |

(Continued)

FOREIGN PATENT DOCUMENTS

| | | |
|---|---|---|
| CN | 104536510 | 4/2015 |
| CN | 114879792 | 8/2022 |
| CN | 115705065 | 2/2023 |

OTHER PUBLICATIONS

Surkanti et al., "Flipped Voltage Follower Based Low Dropout (LDO) Voltage Regulators: A Tutorial Overview," 2018 31th International Conference on VLSI Design and 2018 17th International Conference on Embedded Systems, 2018, pp. 232-237.

*Primary Examiner* — Fernando Hidalgo
(74) *Attorney, Agent, or Firm* — Fish & Richardson P.C.

(57) ABSTRACT

Provided are a low dropout (LDO) regulator controlling operation biasing of a transistor connected to an output node to have a wide bandwidth and provide a stable voltage at a fast speed, and a memory device including the LDO regulator. The LDO regulator includes a first low voltage transistor in which a first terminal thereof is connected to an output node configured to provide an output voltage to a load and a second terminal thereof is connected to a first node, an operational amplifier configured to compare a reference voltage with the output voltage and output the comparison result to a gate terminal of a first low voltage transistor, and an operation biasing control circuit connected to the output node and the first node, and including at least one high voltage transistor.

20 Claims, 13 Drawing Sheets

(56)                  References Cited

U.S. PATENT DOCUMENTS

2023/0130733 A1 *    4/2023   Zhang ...................... G05F 3/26
                                                        323/274

* cited by examiner

Figure 7:
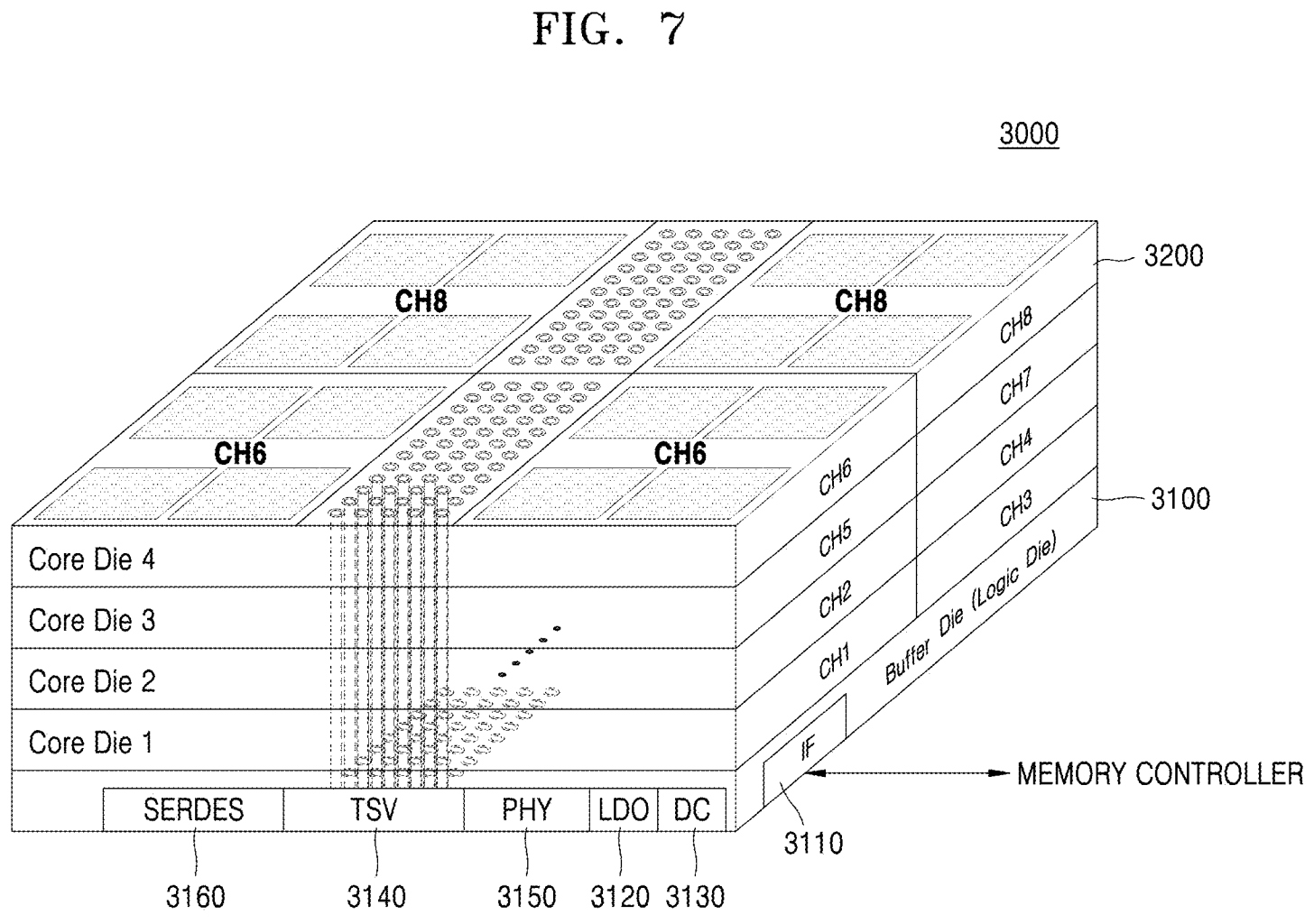

Buffer Die (Logic Die)

CH8

CH6
CH5
CH2
CH1

IF

CH6

CH8

3110

CH6

Core Die 4
Core Die 3
Core Die 2
Core Die 1

SERDES    TSV    PHY    LDO    DC 3160    3140    3150    3120    3130

MEMORY CONTROLLER

LOW DROPOUT REGULATORS

CROSS-REFERENCE TO RELATED APPLICATIONS

This application claims priority under 35 U.S.C. § 119 to Korean Patent Application Nos. 10-2023-0108540, filed on Aug. 18, 2023, and 10-2023-0143253, filed on Oct. 24, 2023, in the Korean Intellectual Property office, the disclosures of which are incorporated by reference herein in their entirety.

TECHNICAL FIELD

Aspects of this disclosure relate to low dropout (LDO) regulators and memory devices including LDO regulators.

BACKGROUND

As the operation speed of memory devices increases, the current consumed by the memory devices increases. Some high-performance memory devices require a high current, which may increase the drop of the output voltage of an LDO regulator which supplies power to the memory devices. To adjust the dropped output voltage to a target voltage, the LDO regulator (e.g., a digital LDO regulator) may control the output current by switching power transistors on/off.

SUMMARY

Some aspects of this disclosure describe a low dropout (LDO) regulator including at least one high voltage transistor and at least one low voltage transistor, which controls an operation biasing of the at least one low voltage transistor, providing a fast and stable voltage with a wide bandwidth, and a memory device including the LDO regulator.

In some implementations, there is provided the LDO regulator including a first low voltage transistor in which a first terminal thereof is connected to an output node configured to provide an output voltage to a load and a second terminal thereof is connected to a first node, an operational amplifier configured to compare a reference voltage with the output voltage and output the comparison result to a gate terminal of a first low voltage transistor, and an operation biasing control circuit connected to the output node and the first node, and including at least one high voltage transistor, wherein the operation biasing control circuit is configured to control an operation biasing of the first low voltage transistor based on a pre-defined voltage.

In some implementations, there is provided a low dropout (LDO) regulator including a first low voltage transistor in which a first terminal thereof is connected to an output node configured to provide an output voltage to a load and a second terminal thereof is connected to a first node, an operational amplifier configured to compare a reference voltage with the output voltage and output the comparison result to a gate terminal of the first low voltage transistor, a first high voltage transistor in which a first terminal thereof is connected to a high power voltage terminal and a second terminal thereof is connected to the output node, and a second high voltage transistor in which a first terminal thereof is connected to a gate terminal of the first high voltage transistor and a second terminal thereof is connected to the first node, wherein the second high voltage transistor includes the first high voltage transistor and a transistor of a different type from the first low voltage transistor.

In some implementations, there is provided a memory device including a buffer die, and a plurality of core dies vertically stacked on the buffer die and connected thereto via a plurality of through silicon vias (TSV), wherein the buffer die includes a first driving circuit configured to generate first output data from first input data and output the generated first output data to a first TSV among the plurality of TSVs, and a first low dropout (LDO) regulator configured to provide a first output voltage of a first output node to the first driving circuit as a supply voltage, wherein the first LDO regulator includes a first low voltage transistor in which a first terminal thereof is connected to the first output node and a second terminal thereof is connected to a first node, a first operational amplifier configured to compare a reference voltage with the first output voltage and output the comparison result to a gate terminal of a first low voltage transistor, and a first operation biasing control circuit connected to the first output node and the first node, and including at least one high voltage transistor, wherein the first operation biasing control circuit is configured to control operation biasing of the first low voltage transistor based on a pre-defined first voltage.

BRIEF DESCRIPTION OF THE DRAWINGS

Implementations will be understood from the following detailed description taken in conjunction with the accompanying drawings in which:

FIG. 7 is a block diagram of a memory device according to some implementations;

DETAILED DESCRIPTION

Hereinafter, various examples are described in detail with reference to the accompanying drawings.

Figure 1:
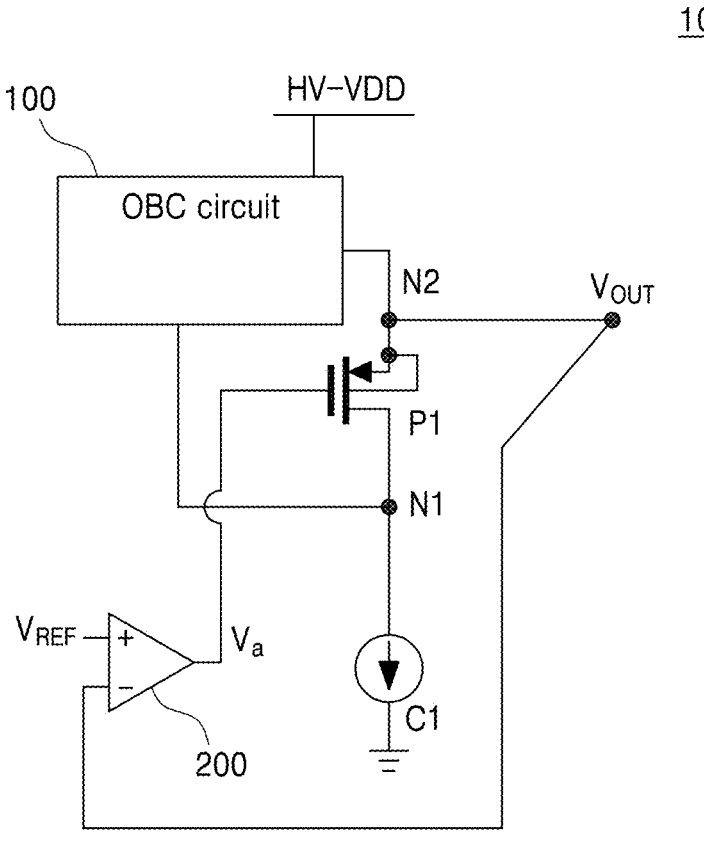
FIG. 1 is a block diagram of a low dropout (LDO) regulator according to some implementations.

FIG. 1 is a block diagram of a low dropout (LDO) regulator 10 according some implementations. In FIG. 1, the LDO regulator 10 is illustrated as including certain components; however, the LDO regulator 10 may further include other circuits and/or circuit components (including those not illustrated herein) without departing from the scope of this disclosure.

Referring to FIG. 1, the LDO regulator 10 may supply a voltage $V_{OUT}$ of an output node N2 to an electronic device connected to the output node N2. The electronic device may include one of various electronic devices requiring a stable voltage, such as a personal computer, a laptop computer, a server, a workstation, a mobile communication terminal, a personal digital assistant (PDA), a portable media player (PMP), a digital camera, a smartphone, a tablet computer, and a wearable device. The electronic device may be referred to as a load.

The LDO regulator 10 may include a first low voltage transistor P1, a current source C1, an operating biasing control (OBC) circuit 100, and an operational amplifier 200.

A low voltage transistor may mean a transistor having a relatively fast operation speed. For example, when transconductance $g_m$ of a particular transistor is greater than a threshold value or a threshold voltage $V_{th}$ of a particular transistor is less than the threshold value, the particular transistor may be referred to as a low voltage transistor. The low voltage transistor may also be referred to as a digital device. The low voltage transistor may have a relatively large transconductance or a relatively low threshold voltage, and accordingly, may have a relatively low breakdown voltage. For example, the low voltage transistor may have a higher transconductance than one or more high voltage transistors included in the LDO regulator 10 (e.g., in the LDO regulators 10a, 10b, 10c, 10d), a lower threshold voltage than the one or more high voltage transistors, and/or a lower breakdown voltage than the one or more high voltage transistors.

The first low voltage transistor P1 may be referred to as a pass transistor, and, in examples described herein, the first low voltage transistor P1 is assumed to be a p-channel (P) metal-oxide-semiconductor (MOS) (PMOS) transistor. However, the first low voltage transistor P1 is not limited thereto. For example, the first low voltage transistor P1 may include an n-channel (N) (MOS) (NMOS) transistor.

The first low voltage transistor P1 may be connected between a first node N1 and the output node N2, and may operate in response to an output voltage $V_a$ of the operational amplifier 200. In some implementations, the output node N2 may be connected to a first terminal (for example, source terminal) of the first low voltage transistor P1, and the first output node N1 may be connected to a second terminal (for example, drain terminal) of the first low voltage transistor P1.

The current source C1 may include tail current having an arbitrary or pre-defined level (e.g., may be a tail current source). The current source C1 may be connected to the first node N1 and ground.

The OBC circuit 100 may be configured to control the operation biasing of the first low voltage transistor P1. The operation biasing control may include an operation of controlling application of a voltage or current (e.g., from an external source) to an electronic circuit for determining an operation level.

Figure 2A:
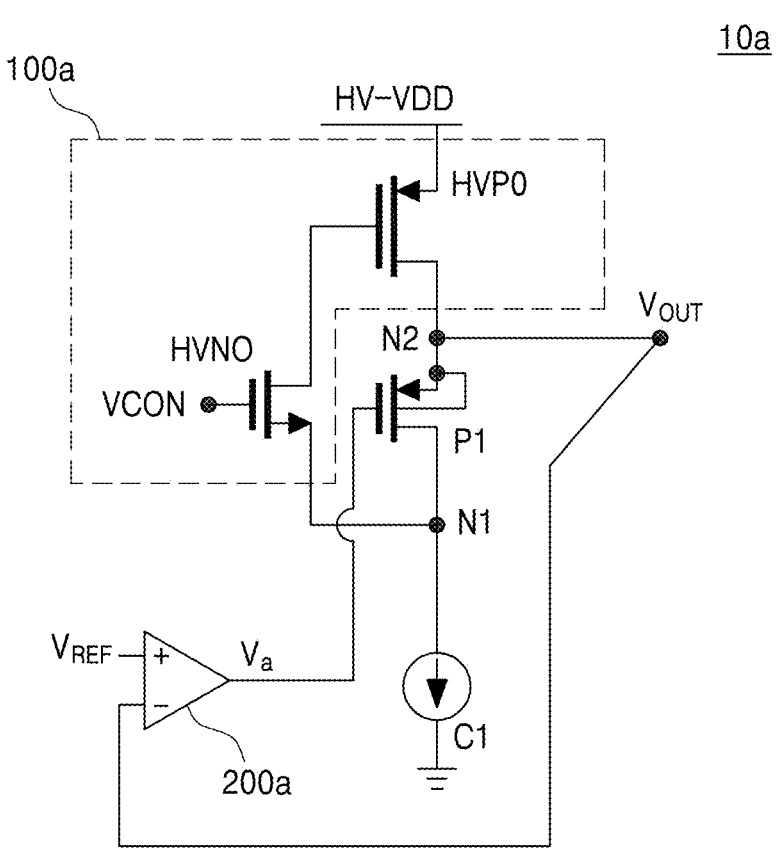
FIG. 2A is a block diagram of an LDO regulator according to some implementations.

In some implementations, the OBC circuit 100 may include at least one high voltage transistor (e.g., as shown in FIG. 2A), and may be connected to a high power voltage terminal and the output node N2. A high voltage transistor may mean a transistor having a relatively slow operation speed. For example, when transconductance $g_m$ of a particular transistor is less than a threshold value or a threshold voltage $V_{th}$ of a particular transistor is greater than the threshold value, the particular transistor may be referred to as a high voltage transistor. A high voltage transistor may also be referred to as an analog device. A high voltage transistor may have a relatively low transconductance or a relatively high threshold voltage, and, thus, may have a relatively high breakdown voltage. The high power voltage terminal may apply a relatively high voltage to a node connected thereto. For example, a high power voltage HV-VDD (e.g., as shown in FIG. 2A) may have a higher level than the threshold voltage. The OBC circuit 100 may receive the high power voltage HV-VDD via the high power voltage terminal, and may transfer the high power voltage HV-VDD applied to the output node N2 via at least one high voltage transistor. For example, the OBC circuit 100 may control application of the high power voltage HV-VDD to the output node N2 and control an operation biasing of the first low voltage transistor P1. The high power voltage HV-VDD may be a relatively high voltage, and, thus, the LDO regulator 10 may have a relatively wide bandwidth. Accordingly, the LDO regulator 10 may supply the voltage $V_{OUT}$ fast and stably even when the change width of the voltage $V_{OUT}$ of the output node N2 due to the electronic device connected to the output node N2 is large.

In some implementations, the OBC circuit 100 may include at least one high voltage transistor, and may maintain a voltage of the first node N1 connected to the second terminal of the first low voltage transistor P1 below a threshold voltage (e.g., corresponding to less than a breakdown voltage being applied across the first low voltage transistor P1). For example, the OBC circuit 100 may control a voltage applied to the first node N1 and control an operation biasing of the first low voltage transistor P1. Detailed descriptions of implementations of the OBC circuit 100 are described below with reference to FIGS. 2A, 4A, and 5.

The operational amplifier 200 may amplify the difference between a level of a reference voltage $V_{REF}$ and a level of the voltage $V_{OUT}$ of the output node N2, and generate the output voltage $V_a$. Input terminals of the operational amplifier 200 may be connected to a reference voltage VREF terminal and the output node N2, and an output terminal of the operational amplifier 200 may be connected to a gate terminal of the first low voltage transistor P1. In some implementations, the reference voltage $V_{REF}$ may be applied to a positive input terminal of the operational amplifier 200, and a voltage $V_{OUT}$ of the output node N2 may be applied to a negative input terminal of the operational amplifier 200.

The OBC circuit 100 may control operation biasing of the first low voltage transistor P1, and the LDO regulator 10 may have a relatively wide bandwidth. For example, the LDO regulator 10 may operate at a high speed. For example, the LDO regulator 10 may have a bandwidth equal to or greater than about 250 MHZ, and accordingly, when the voltage $V_{OUT}$ of the output node N2 is changed from an initial voltage, the LDO regulator 10 may supply stably the initial voltage again in about 4 ns.

Figure 2B:
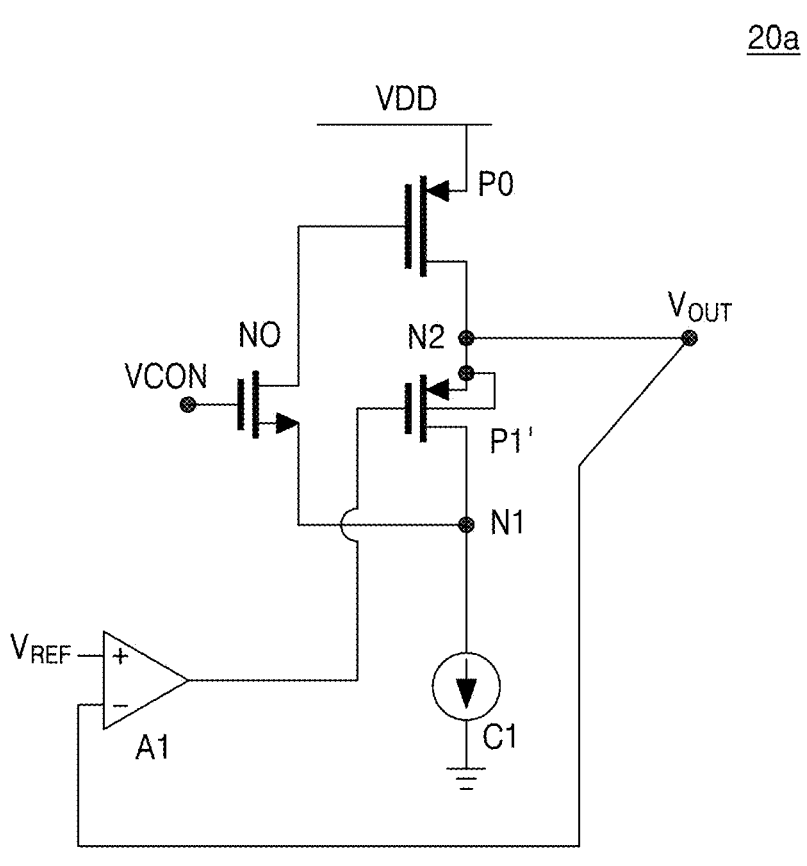
FIG. 2B is a block diagram of a comparative LDO regulator.

FIG. 2A is a block diagram of an LDO regulator 10a according to some implementations, and FIG. 2B is a block diagram of an LDO regulator 20a for comparison. Description provided with respect to LDO regulator 10 can be applied to LDO regulator 10a, except where noted otherwise.

Referring to FIG. 2A, the LDO regulator 10a may include the first low voltage transistor P1, the current source C1, an OBC circuit 100a, and an operational amplifier 200a. The first low voltage transistor P1, the current source C1, and the operational amplifier 200a may be the same as the first low voltage transistor P1, the current source C1, and the operational amplifier 200 in FIG. 1, respectively, and thus, duplicate descriptions with reference to FIG. 1 are omitted.

The OBC circuit 100a may include a first high voltage transistor HVP0 and a second high voltage transistor HVN0. The first high voltage transistor HVP0 may be connected between the high power voltage terminal and the output node N2, and may operate in response to a voltage of a first terminal (for example, drain terminal) of the second high voltage transistor HVN0. The second high voltage transistor HVN0 may be connected between a gate terminal of the first high voltage transistor HVP0 and the first node N1, and may operate in response to a voltage VCON applied from the outside the LDO regulator 10a.

In some implementations, the OBC circuit 100a may control operation biasing of the first low voltage transistor P1 based on the voltage VCON. The voltage VCON may include a pre-defined voltage. For example, the voltage VCON may include a pre-defined voltage according to characteristics of an electronic device connected to the output node N2, and, based on receiving the voltage VCON via the gate terminal of the second high voltage transistor HVN0, the second high voltage transistor HVN0 may maintain a voltage of the first node N1 constant based on the voltage VCON. For example, the pre-defined voltage can comply with one or more characteristics of the load (electronic device), e.g., can result in a $V_{OUT}$ that the electronic device is configured to receive.

In some implementations, a loop may be formed by using the first high voltage transistor HVP0, the second high voltage transistor HVN0, and the first low voltage transistor P1. For example, when the voltage $V_{OUT}$ of the output node N2 is instantaneously reduced by an electronic device connected to the output node N2, the reduced voltage $V_{OUT}$ may be applied to the first terminal of the first low voltage transistor P1. While a loop is formed, the voltage $V_a$ may be constant, and the first low voltage transistor P1 may output the voltage of the first node N1 as a sufficiently reduced voltage via the second terminal of the first low voltage transistor P1. The second high voltage transistor HVN0 may output the voltage applied to the second terminal of the second high voltage transistor HVN0 via the first terminal of the second high voltage transistor HVN0. The first high voltage transistor HVP0 may receive a voltage of sufficiently reduced level at the gate terminal of the first high voltage transistor HVP0 and increase the level of a current flowing between the first terminal and the second terminal of the first high voltage transistor HVP0. The first high voltage transistor HVP0, the second high voltage transistor HVN0, and the first low voltage transistor P1 may operate as an amplifier by forming a loop, and the instantaneously reduced voltage $V_{OUT}$ may be restored to its original voltage level in a relatively fast way. In this case, because the first high voltage transistor HVP0 is a high voltage transistor, the first high voltage transistor HVP0 may be compatible with a higher voltage than a low voltage transistor, and, by being connected to the high power voltage terminal, may increase a level of the current flowing between the first terminal and the second terminal of the first high voltage transistor HVP0 based on the high power voltage HV-VDD. Accordingly, the LDO regulator 10a may have a relatively wide bandwidth, and even when the change width of the voltage $V_{OUT}$ of the output node N2 due to an electronic device connected to the output node N2 is large, the LDO regulator 10a may supply a voltage fast and stably.

In some implementations, the second high voltage transistor HVN0 may maintain a voltage of the first node N1 less than a threshold voltage, and accordingly, the LDO regulator 10a may include the first low voltage transistor P1 having a relatively low breakdown voltage. A transistor having a relatively low breakdown voltage may mean a transistor having a relatively fast operation speed. For example, assuming a case (not illustrated) in which there is no second high voltage transistor HVN0, the gate terminal of the first high voltage transistor HVP0 may be connected to the first node N1, and the voltage level of the first node N1 may be greater than the breakdown voltage of the first low voltage transistor P1 (or otherwise result in the voltage across the first low voltage transistor P1 being greater than the breakdown voltage) due to the high power voltage HV-VDD. In this case, the first low voltage transistor P1 may not endure the voltage level of the first node N1, and may operate erroneously. Accordingly, in some implementations, the threshold voltage may be less than the breakdown voltage of the first low voltage transistor P1 to prevent the malfunction of the first low voltage transistor P1, and the second high voltage transistor HVN0 may maintain the voltage of the first node N1 less than the threshold voltage based on the voltage VCON received by the gate terminal of the second high voltage transistor HVN0. Because the LDO regulator 10a includes the first low voltage transistor P1 having a relatively low breakdown voltage, the LDO regulator 10a may supply the voltage $V_{OUT}$ fast and stably.

Referring further to FIG. 2B, the LDO regulator 20a according to this comparative circuit may have the same structure as the LDO regulator 10a of FIG. 2A, but may include a first transistor P0, a second transistor N0, and a third transistor P1' instead of the first high voltage transistor HVP0, the second high voltage transistor HVN0, and the first low voltage transistor P1, respectively. Because the first transistor P0 may not be a high voltage transistor, the first transistor P0 may not be compatible with a relatively high voltage, and a power voltage VDD may have a relatively lower level than the high power voltage HV-VDD in FIG. 2A. Due to the power voltage VDD having a relatively low level, the bandwidth of the LDO regulator 20a may be less than the bandwidth of the LDO regulator 10a of FIG. 2A. Accordingly, in some implementations, the LDO regulator 10a of FIG. 2A may supply the voltage $V_{OUT}$ faster and more stable than the LDO regulator 20a.

In addition, because the second transistor N0 may not be a high voltage transistor, the voltage level of the first node N1 may not be maintained at a lower level than the voltage level of the second transistor N0 when the second transistor N0 is a high voltage transistor. Accordingly, the voltage of the first node N1 may be maintained at a higher level than the voltage of the first node N1 in FIG. 2B, and the breakdown voltage of the third transistor P1' in FIG. 2B may be higher than the breakdown voltage of the first low voltage transistor P1 in FIG. 2A. Because an operation speed may be relatively faster when the breakdown voltage decreases, the operation speed of the first low voltage transistor P1 in FIG. 2A may be faster than the operation speed of the third transistor P1'. Accordingly, in some implementations, the LDO regulator 10a of FIG. 2 may supply the voltage $V_{OUT}$ faster and more stably than the LDO regulator 20a.

Referring again to FIG. 2A, in some implementations, the second high voltage transistor HVN0 may be a transistor of a different type from the first high voltage transistor HVP0 and the first low voltage transistor P1. When the second high voltage transistor HVN0 is a high voltage transistor of a first type, the first high voltage transistor HVP0 may be a high voltage transistor of a second type, and the first low voltage transistor P1 may be a low voltage transistor of a second type. For example, when the second high voltage transistor HVN0 is an NMOS transistor, the first high voltage transistor HVP0 and the first low voltage transistor P1 may be PMOS transistors. For example, when the second high voltage transistor HVN0 is a PMOS transistor, the first high voltage transistor HVP0 and the first low voltage transistor P1 may be NMOS transistors.

Figure 3A:
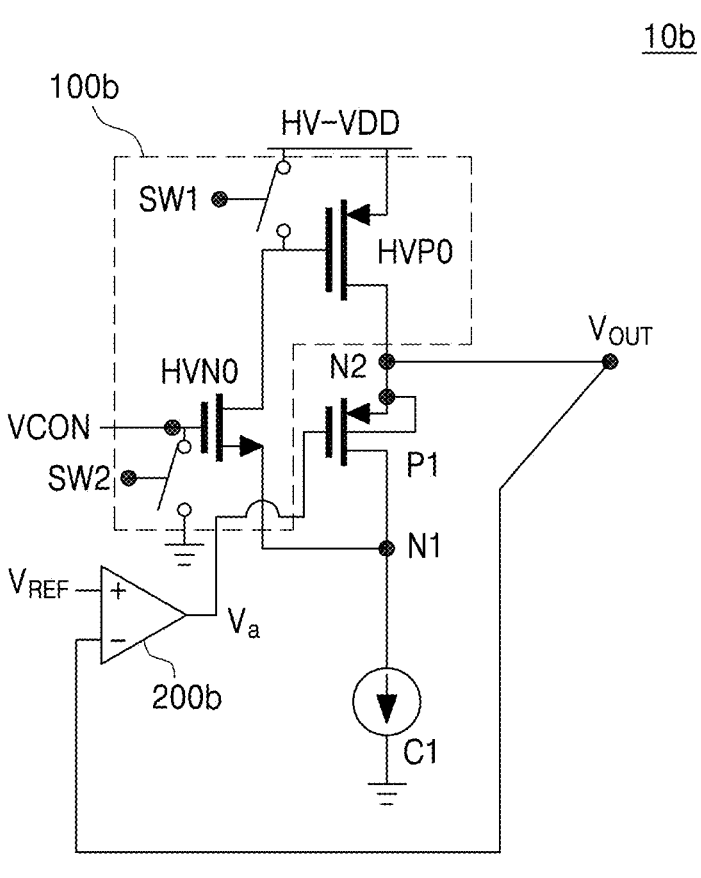
FIG. 3A is a block diagram of an LDO regulator according to some implementations.
Figure 3B:
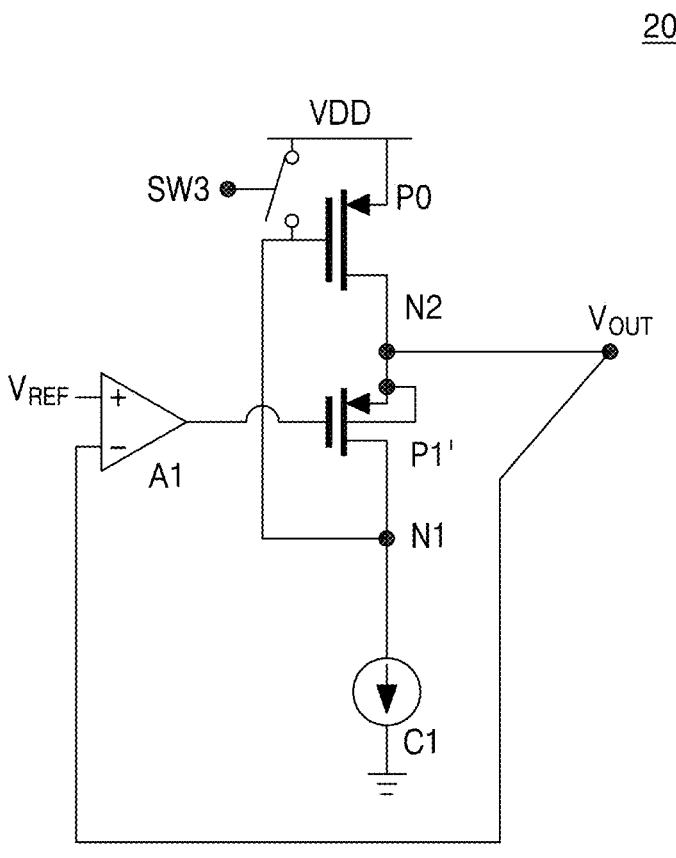
FIG. 3B is a block diagram of a comparative LDO regulator.

FIG. 3A is a block diagram of an LDO regulator 10b according to some implementations, and FIG. 3B is a block diagram of an LDO regulator 20*b* illustrating a comparative circuit. Description provided with respect to LDO regulators 10 and 10*a* can be applied to LDO regulator 10*b*, except where noted otherwise.

Referring to FIG. 3A, the LDO regulator 10*b* may include the first low voltage transistor P1, the current source C1, an OBC circuit 100*b*, and an operational amplifier 200*b*, a first switch SW1, and a second switch SW2. The first low voltage transistor P1, the current source C1, the OBC circuit 100*b*, and the operational amplifier 200*b* may be the same as the first low voltage transistor P1, the current source C1, the OBC circuit 100*a*, and the operational amplifier 200*a* in FIG. 2A, respectively, and thus, duplicate descriptions thereof are omitted.

Referring further to FIG. 3B, the LDO regulator 20*b* according in the comparative circuit may include the first transistor P0, the second transistor P1', the current source C1, an operational amplifier A1, and a third switch SW3. An electronic device may be connected to the output node N2, and, in an assumed scenario, the electronic device is powered down. Powered down may mean a case in which power supply to the electronic device is stopped from the output node N2. The LDO regulator 20*b* may operate the third switch SW3 to stop voltage supply to the electronic device by selectively connecting a power voltage terminal to the gate terminal of the first transistor P0, and may reduce current flowing between the first terminal (for example, source terminal) to the second terminal (for example, drain terminal) of the first transistor P0. In this case, by using the third switch SW3, the first node N1 may be connected to the power voltage terminal, and the voltage of the first node N1 may increase up to the level of the power voltage VDD. When the level of the power voltage VDD is higher than the breakdown voltage of the second transistor P1', the second transistor P1' may not be compatible with the voltage of the first node N1, "hich' has been increased to the level of the power voltage VDD, and may operate erroneously. When the level of the power voltage VDD is lower than the breakdown voltage of the second transistor P1', the level of the power voltage VDD may be relatively low, and due to the power voltage VDD of the relatively low level, the bandwidth of the LDO regulator 20*b* may be relatively narrow. When the level of the power voltage VDD is lower than the breakdown voltage of the second transistor P1', the second transistor P1' may not be the low voltage transistor, and an operation speed of the second transistor P1' may be relatively slow.

Referring again to FIG. 3A, the first switch SW1 may be configured to selectively connect the high power voltage terminal to the gate terminal of the first high voltage transistor HVP0, and the second switch SW2 may be configured to selectively connect the gate terminal of the second high voltage transistor HVN0 to ground.

In some implementations, an electronic device may be connected to the output node N2, and when the electronic device is powered down, the first switch SW1 and the second switch SW2 may operate. For example, when the electronic device is powered down, the LDO regulator 10*b* may connect the high power voltage terminal to the gate terminal of the first high voltage transistor HVP0 by operating the first switch SW1 to stop voltage supply to the electronic device, and a current flowing between the first terminal (for example, source terminal) and the second terminal (for example, drain terminal) of the first high voltage transistor HVP0 may be reduced. The LDO regulator 10*b* may operate the second switch SW2 while operating the first switch SW1. The gate terminal of the second high voltage transistor HVN0 may be connected to ground by using the second switch SW2, and a current flowing between the first terminal (for example, source terminal) and the second terminal (for example, source terminal) of the second high voltage transistor HVN0 may be reduced. Accordingly, an increase in the voltage of the first node N1 may be reduced or prevented, so that the first high voltage transistor HVP0 may be connected to the high power voltage terminal, and the first low voltage transistor P1 may be used as the low voltage transistor. The LDO regulator 10*b* in some implementations may be connected to the high power voltage terminal to have a relatively wide bandwidth, and, because the operation speed of the LDO regulator 10*b* may be relatively fast by using the low voltage transistor, the LDO regulator 10*b* may prevent or reduce malfunctions when powering down while supplying fast and stable voltage $V_{OUT}$ to the electronic device connected to the output node N2.

Figure 4A:
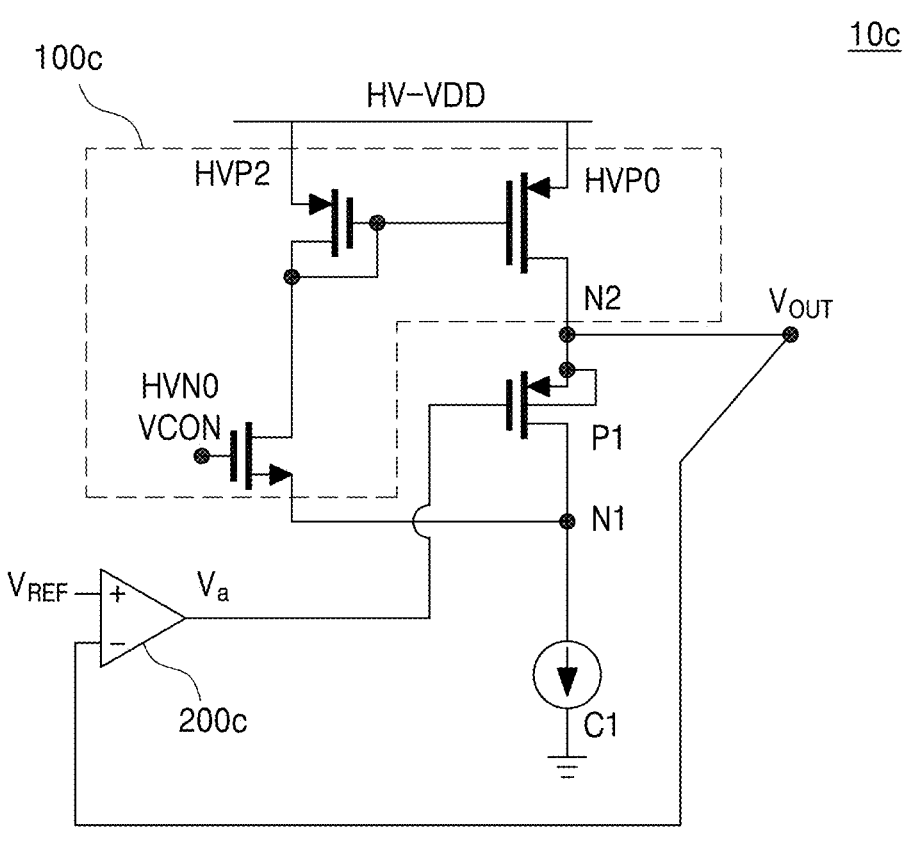
FIG. 4A is a block diagram of an LDO regulator according to some implementations.
Figure 4B:
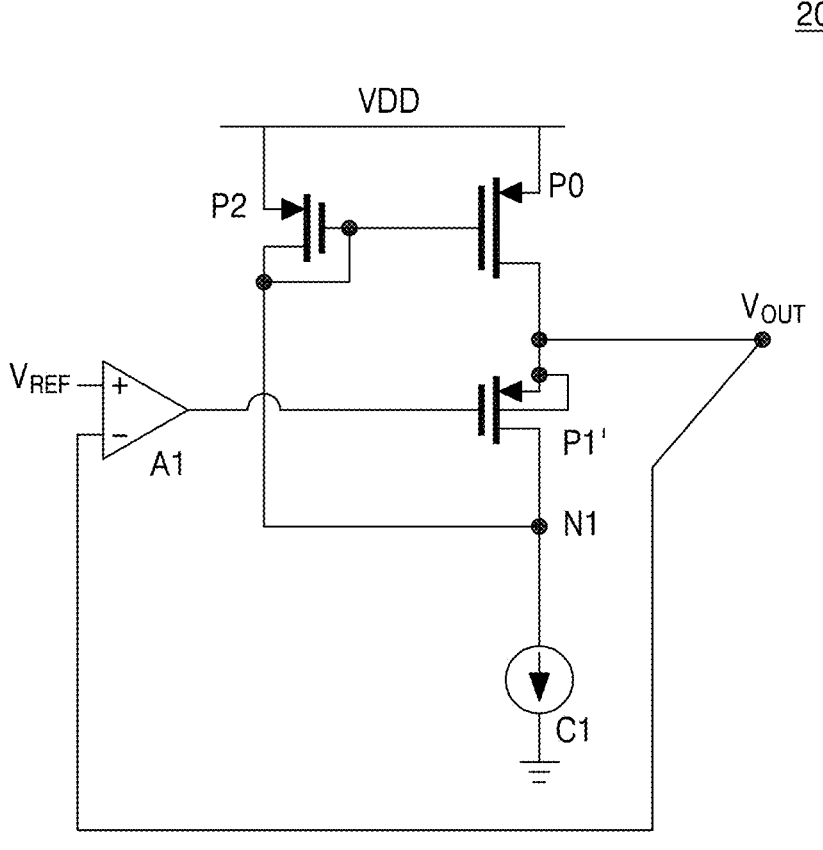
FIG. 4B is a block diagram of a comparative LDO regulator.

FIG. 4A is a block diagram of an LDO regulator 10*c* according to some implementations, and FIG. 4B is a block diagram of an LDO regulator 20*c* illustrating a comparative circuit. Description provided with respect to LDO regulator 10 can be applied to LDO regulator 10*c*, except where noted otherwise.

Referring to FIG. 4A, the LDO regulator 10*c* may include the first low voltage transistor P1, the current source C1, an OBC circuit 100*c*, and an operational amplifier 200*c*. The first low voltage transistor P1, the current source C1, and the operational amplifier 200*c* may be the same as the first low voltage transistor P1, the current source C1, and the operational amplifier 200 in FIG. 1, respectively, and thus, duplicate descriptions thereof with reference to FIG. 1 are omitted.

The OBC circuit 100*c* may include the first high voltage transistor HVP0, the second high voltage transistor HVN0, and a third high voltage transistor HVP2. The first high voltage transistor HVP0 may be connected between the high power voltage terminal and the output node N2, and may operate in response to a voltage of the first terminal (for example, drain terminal) of the second high voltage transistor HVN0. The second high voltage transistor HVN0 may be connected between a gate terminal of the first high voltage transistor HVP0 and the first node N1, and may operate in response to a voltage VCON applied from external to the LDO regulator 10*c*. The voltage VCON may include a pre-defined voltage. For example, the voltage VCON may be a pre-defined voltage according to characteristics of the electronic device connected to the output node N2. The third high voltage transistor HVP2 may be connected between the high power voltage terminal and the first terminal of the second high voltage transistor HVN0, and the gate terminal of the third high voltage transistor HVP2 may be connected to the gate terminal of the first high voltage transistor HVP0.

In some implementations, a loop may be formed by using the first high voltage transistor HVP0, the second high voltage transistor HVN0, and the first low voltage transistor P1. The loop may be the same as the loop described above with reference to FIG. 2A, and thus, duplicate descriptions thereof are omitted. Because the first high voltage transistor HVP0 and the third high voltage transistor HVP2 are high voltage transistors, they may be compatible with higher voltage than the high voltage transistor, and the level of current flowing between the first terminal and the second terminal of each of the first high voltage transistor HVP0 and the third high voltage transistor HVP2 based on the high power voltage HV-VDD by being connected to the high power voltage terminal may be increased. Accordingly, in some implementations, the LDO regulator 10c may have a relatively wide bandwidth, and even when the change width of the voltage $V_{OUT}$ of the output node N2 due to the electronic device connected to the output node N2 is large, the LDO regulator 10c may supply a voltage fast and stably.

In some implementations, the second high voltage transistor HVN0 may maintain a voltage of the first node N1 less than a threshold voltage, and accordingly, the LDO regulator 10c may include the first low voltage transistor P1 having a relatively low breakdown voltage. A transistor having a relatively low breakdown voltage may mean a transistor having a relatively fast operation speed. For example, assuming a case in which there is no second high voltage transistor HVN0 and third high voltage transistor HVP2, the gate terminal of the first high voltage transistor HVP0 may be connected to the first node N1, and the voltage level of the first node N1 may be greater than the breakdown voltage of the first low voltage transistor P1 (or otherwise result in the voltage across the first low voltage transistor P1 being greater than the breakdown voltage) due to the high power voltage HV-VDD. In this case, the first low voltage transistor P1 may not be compatible with the voltage level of the first node N1, and may operate erroneously. Accordingly, in some implementations to prevent malfunction of the first low voltage transistor P1, the threshold voltage may be less than the breakdown voltage of the first low voltage transistor P1 or less than a voltage that would result in the voltage across the first low voltage transistor P1 being greater than the breakdown voltage, and the second high voltage transistor may maintain the voltage of the first node N1 below the threshold voltage. Because the LDO regulator 10c includes the first low voltage transistor P1 having a relatively low breakdown voltage, the LDO regulator 10a may supply the voltage $V_{OUT}$ fast and stably.

In some implementations, the first high voltage transistor HVP0 may be larger than the second high voltage transistor HVN0 or the third high voltage transistor HVP2. For example, the size of the first high voltage transistor HVP0 may be greater than the size of the second high voltage transistor HVN0 and the size of the third high voltage transistor HVP2.

In some implementations, the second high voltage transistor HVN0 may adjust an operating point of the first low voltage transistor P1. The adjusting of the operating point of the first low voltage transistor P1 may mean adjusting a voltage or current applied to a transistor for operating a transistor. For example, referring further to FIG. 4B, the LDO regulator 20c in the comparative circuit may include the first transistor P0, the second transistor P1', the third transistor P2, the current source C1, and the operational amplifier A1. The voltage of the second terminal (for example, drain terminal) of the second transistor P1' may be determined based on the third transistor P2, and the second transistor P1' may not enter a saturation region according to the voltage of the second terminal (for example, drain terminal) of the second transistor P1' and may not enter a triode region to operate as an amplifier. By contrast, in some implementations, the second high voltage transistor HVN0 of the LDO regulator 10c of FIG. 4A may operate according to the pre-defined voltage VCON, and may adjust the voltage of the first node N1. By adjusting the voltage of the first node N1, the second high voltage transistor HVN0 may prevent the first low voltage transistor P1 from entering the triode region. Accordingly, the second high voltage transistor HVN0 may adjust the operating point of the first low voltage transistor P1.

In some implementations, a gain of the LDO regulator 10c may be greater than a gain of the LDO regulator 20c of FIG. 4B. For example, the LDO regulator 20c of FIG. 4B may have a loop formed by the first transistor P0 and the second transistor P1'. While the loop in the LDO regulator 20c of FIG. 4B outputs a gain amplified by the second transistor P1', the loop formed by the first high voltage transistor HVP0, the second high voltage transistor HVN0, and the first low voltage transistor P1 in the LDO regulator 10c may output a gain amplified by the second high voltage transistor HVN0 and the first low voltage transistor P1, and thus, the gain of the LDO regulator 10c may be greater than the gain of the LDO regulator 20c of FIG. 4B in some implementations.

In some implementations, the second high voltage transistor HVN0 may include a transistor of a different type from the first high voltage transistor HVP0, the third high voltage transistor HVP2, and the first low voltage transistor P1. For example, when the second high voltage transistor HVN0 is a high voltage transistor of a first type, the first high voltage transistor HVP0 and the third high voltage transistor HVP2 may be a high voltage transistor of a second type, and the first low voltage transistor P1 may be a low voltage transistor of a second type. For example, when the second high voltage transistor HVN0 is an NMOS transistor, the first high voltage transistor HVP0, the third high voltage transistor HVP2, and the first low voltage transistor P1 may be PMOS transistors. For example, when the second high voltage transistor HVN0 is a PMOS transistor, the first high voltage transistor HVP0, the third high voltage transistor HVP2, and the first low voltage transistor P1 may be NMOS transistors.

Figure 5:
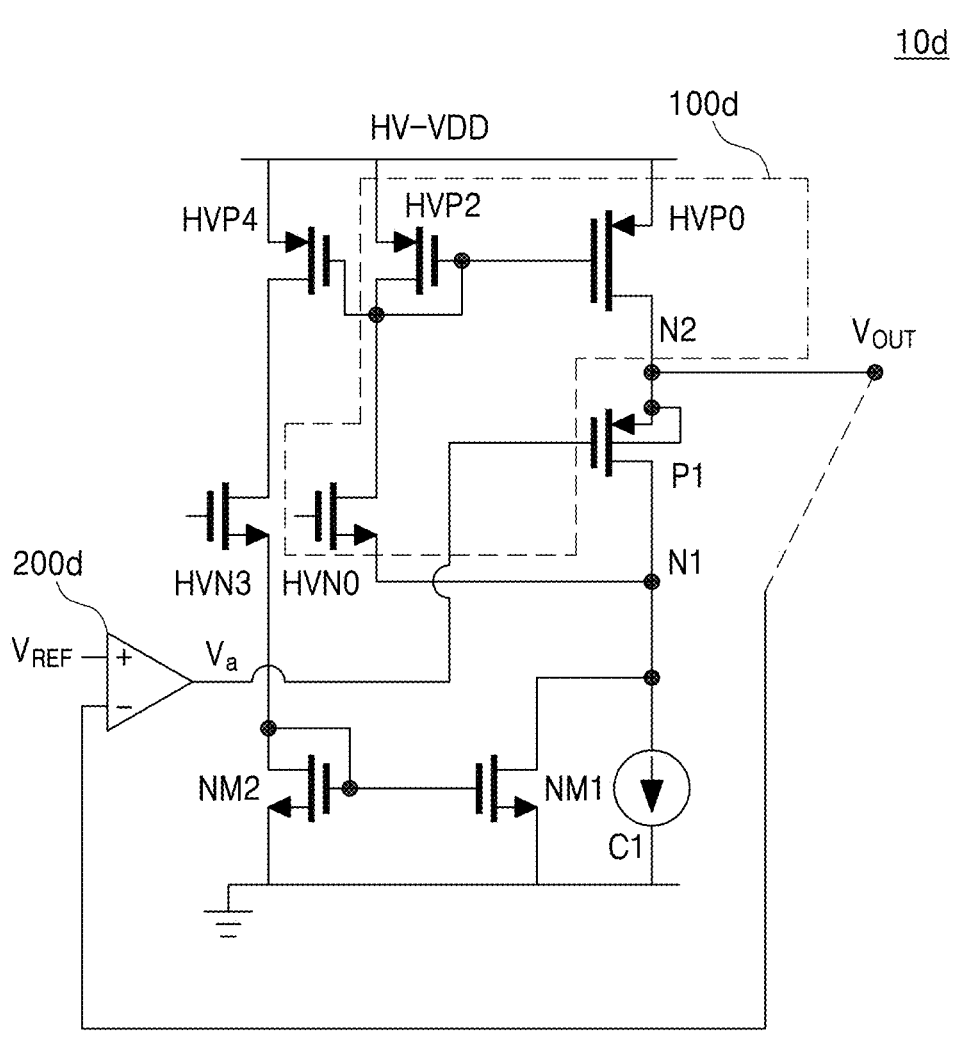
FIG. 5 is a block diagram of an LDO regulator according to some implementations.

FIG. 5 is a block diagram of an LDO regulator 10d according to some implementations. Description provided with respect to LDO regulator 10 can be applied to LDO regulator 10d, except where noted otherwise.

Referring to FIG. 5, the LDO regulator 10d may include an OBC circuit 100d, an operational amplifier 200d, the current source C1, the second and fifth high voltage transistors HVN0 and HVN3, and the first, second, and third low voltage transistors P1, NM1, and NM2. The first low voltage transistor P1, the OBC circuit 100d, the current source C1, and the operational amplifier 200d may be the same as the first low voltage transistor P1, the OBC circuit 100c, the current source C1, and the operational amplifier 200c in FIG. 4A, and thus, duplicate descriptions thereof are omitted.

A fourth high voltage transistor HVP4 may be connected between the high power voltage terminal and the first terminal (for example, source terminal) of the fifth high voltage transistor HVN3, and the gate terminal of the fourth high voltage transistor HVP4 may be connected to the gate terminal of the first high voltage transistor HVP0. The fifth high voltage transistor HVN3 may be connected between the fourth high voltage transistor HVP4 and a third low voltage transistor NM2.

The third low voltage transistor NM2 may be connected between the fifth high voltage transistor HVN3 and ground, and the gate terminal of the third low voltage transistor NM2 may be connected to the first terminal (for example, drain terminal) of the third low voltage transistor NM2.

A second low voltage transistor NM1 may be connected between the first node N1 and ground, and the gate terminal of the second low voltage transistor NM1 may be connected to the gate terminal of the third low voltage transistor NM2.

In some implementations, the second high voltage transistor HVN0, the fifth high voltage transistor HVN3, the second low voltage transistor NM1, and the third low voltage transistor NM2 may be transistors of different types from the first high voltage transistor HVP0, the third high voltage transistor HVP2, the fourth high voltage transistor HVP4, and the first low voltage transistor P1, respectively. For example, when the second high voltage transistor HVN0 and the fifth high voltage transistor HVN3 are high voltage transistors of a first type, the second low voltage transistor NM1 and the third low voltage transistor NM2 are low voltage transistors of first type, the first high voltage transistor HVP0, the third high voltage transistor HVP2, and the fourth high voltage transistor HVP4 may be high voltage transistors of second type, and the first low voltage transistor P1 may be a low voltage transistor of a second type.

For example, when the second high voltage transistor HVN0, the fifth high voltage transistor HVN3, the second low voltage transistor NM1, and the third low voltage transistor NM2 are NMOS transistors, the first high voltage transistor HVP0, the third high voltage transistor HVP2, the fourth high voltage transistor HVP4, and the first low voltage transistor P1 may be PMOS transistors. For example, when the second high voltage transistor HVN0, the fifth high voltage transistor HVN3, the second low voltage transistor NM1, and the third low voltage transistor NM2 are PMOS transistors, the first high voltage transistor HVP0, the third high voltage transistor HVP2, the fourth high voltage transistor HVP4, and the first low voltage transistor P1 may be NMOS transistors.

Figure 6:
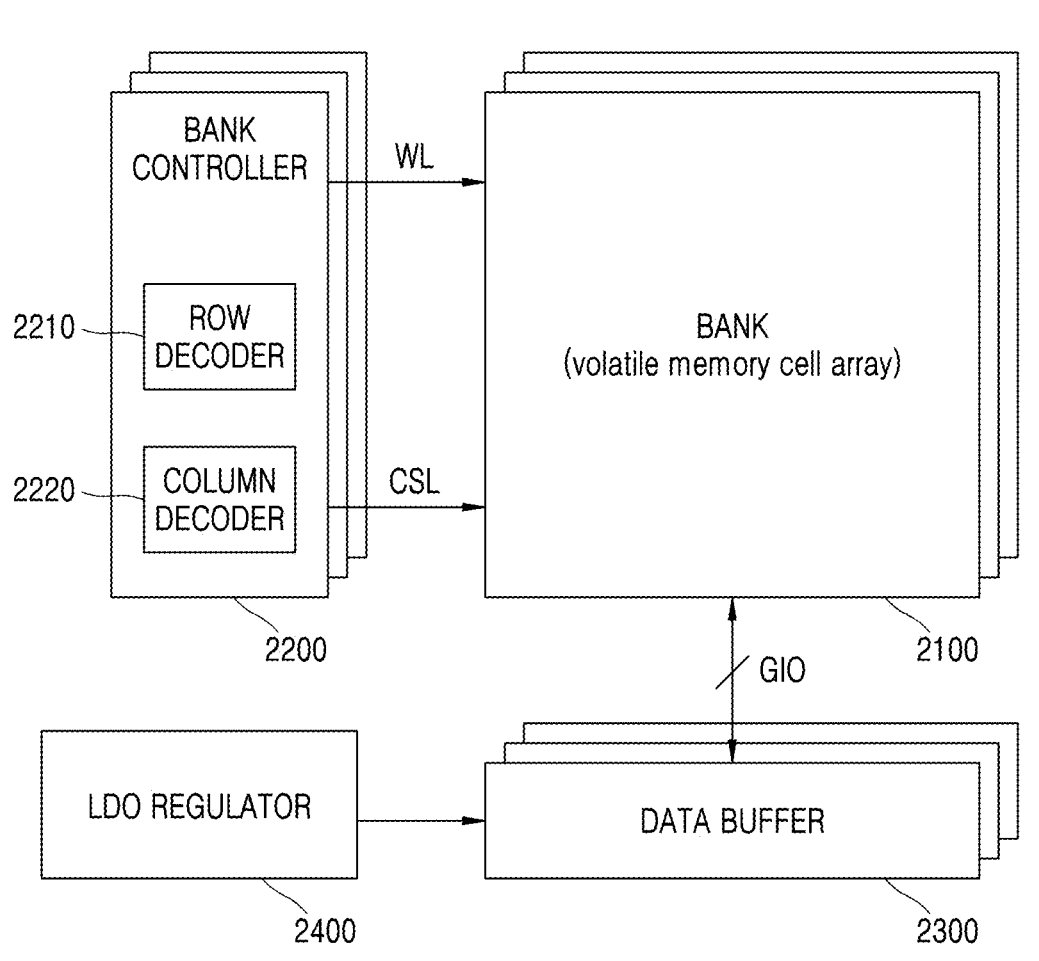
FIG. 6 is a block diagram of a memory device according to some implementations.

FIG. 6 is a block diagram of a memory device 2000 according to some implementations.

Referring to FIG. 6, the memory device 2000 may include at least one memory chip. In some implementations, the memory device 2000 is described as including a high bandwidth memory (HBM) chip providing a high bandwidth. For example, the memory device 2000 may include a plurality of memory chips, and the memory chip may include a volatile memory chip such as dynamic random access memory (RAM) (DARM). A volatile memory chip may include general-purpose DRAM chips, such as a double data rate (DDR) synchronous dynamic RAM (SDRAM) (DDR SDRAM) chip, a DDR2 SDRAM chip, a DDR3 SDRAM chip, and a DDR4 SDRAM chip, or a mobile application chip, such as a low power (LP) DDR (LPDDR) SDRAM chip, an LPDDR2 SDRAM chip, an LPDDR3 SDRAM chip, an LPDDR4X SDRAM chip, and an LPDDR5 SDRAM chip, or a DRAM chip providing a high bandwidth, such as a graphics DDR (GDDR) synchronous graphics RAM (SGRAM) (GDDR SGRAM) chip, a GDDR2 SGRAM chip, a GDDR3 SGRAM chip, a GDDR4 SGRAM chip, a GDDR5 SGRAM chip, a GDDR6 SGRAM chip, and wide input/output (IO) (WIO) SDRAM chip.

The memory device 2000 may include a bank 2100, a bank controller 2200, a data buffer 2300, and an LDO regulator 2400. The bank 2100 may include a memory cell array including memory cells which are repeatedly arranged. The memory cells may be arranged at crossing points of word lines (not illustrated) and bit lines (not illustrated) in the bank 2100. The number of banks 2100 may be determined in advance according to various conventions of memory chips. As the number of banks 2100 increases, all the memory cells of the memory device 2000 may be divided into more banks.

The bank controller 2200 may control the bank 2100, based on a bank control signal, a row control signal, and a column control signal. The bank controller 2200 may include a row decoder 2210 and a column decoder 2220. The row decoder 2210 may receive a row control signal and a row address, and based on the operation result, may select a word line WL. The row decoder 2210 may be arranged in a direction in which the word lines WL are arranged at a certain interval, to drive the word lines WL in the bank 2100. The column decoder 2220 may receive a column control signal and a column address, and based on the operation result, may select a column selection line CSL. At least one bit line BL may be connected to the column selection line CSL, and may be arranged in a direction in which the bit lines BL connected to the column selection line CSL are arranged at regular intervals by the column decoder 2220.

The data buffer 2300 may transmit write data to the bank 2100 via global input/output lines GIO, or may receive read data from the bank 2100 via the global input/output lines GIO. The number of data buffers 2300 may be the same as the number of banks 2100, and the data buffer 2300 may exchange data with each of the banks 2100.

The LDO regulator 2400 may be the same as one of the LDO regulators described above, e.g., LDO regulator 10, 10a, 10b, 10c, or 10d. In some implementations, the LDO regulator 2400 may be connected to the data buffer 2300 to supply power thereto. For example, the data buffer 2300 may include a plurality of inverters (not illustrated), and the plurality of inverters (not illustrated) may be connected to the bank 2100 to transmit write data to the bank 2100. The LDO regulator 2400 may include at least one high voltage transistor and at least one low voltage transistor to have a relatively wide bandwidth, and may supply stable power to the plurality of inverters (not illustrated) for operating at high speed. For example, the data buffer can receive $V_{OUT}$ provided by the LDO regulator 10, 10a, 10b, 10c, or 10d.

In some implementations, the LDO regulator 2400 may include a high voltage transistor (for example, the second high voltage transistor HVN0 in FIG. 2A), and a pre-defined voltage (for example, the voltage VCON in FIG. 2A) may be applied to the gate terminal of the high voltage transistor according to the characteristics of the memory cells of the bank 2100.

FIG. 7 is a block diagram of a memory device 3000 according to some implementations.

Referring to FIG. 7, the memory device 3000 may be connected to a host device (not illustrated) by using an HBM protocol of the JEDEC standard. The HBM protocol may be a high-performance RAM interface for three-dimensional stacked memories (for example, DRAM). The memory device 3000 may generally achieve a wider bandwidth while consuming less power by using a form factor that is substantially less, than other DRAM technologies (for example, DDR4, GDDR5, etc.).

The memory device 3000 may have a high bandwidth by including first through eighth channels CH1 through CH8 having interfaces independent of each other. The memory device 3000 may include a plurality of dies, and may include, for example, a buffer die 3100 and one or more core dies 3200 stacked on the buffer die 3100. In FIG. 7, an example is illustrated in which first through fourth core dies Core Die 1 through Core Die 4 are provided in the memory device 3000, but the number of core dies 3200 may be variously changed. The core dies 3200 may be referred to as memory dies.

Each of the core dies 3200 may include one or more channels. In FIG. 7, as each of the core dies 3200 includes two channels, an example is illustrated in which the memory device 3000 includes eight channels (the first through eighth channels CH1 through CH8). For example, the first core die Core Die 1 may include the first and third channels CH1 and CH3, the second core die Core Die 2 may include the second and fourth channels CH2 and CH4, the third core die Core Die 3 may include the fifth and seventh channels CH5 and CH7, and the fourth core die Core Die 4 may include the sixth and eighth channels CH6 and CH8.

The buffer die 3100 may include an interface (IF) circuit 3110 communicating with a host device, and may receive command/address and data from the host device via the IF circuit 3110. The host device may transmit command/address and data via buses arranged corresponding to the channels, and the buses may be formed to be divided for each channel, or some buses may be shared by at least two channels. The IF circuit 3110 may transfer commands/addresses and data to channels to which the host device requests a memory operation or an operation process.

The buffer die 3100 may further include an LDO regulator 3120 (e.g., any of the LDO regulators described above, such as LDO regulators 10, 10a, 10b, 10c, and 10d), a driving circuit (DC) 3130, a through silicon via (TSV) region 3140, an HBM physical layer interface (PHY) region 3150, and a serializer/deserializer (SERDES) region 3160.

In FIG. 7, the LDO regulator 3120 and the DC 3130 are illustrated as one LDO regulator and one driving circuit, respectively, but are not limited thereto. For example, the buffer die 3100 may further include two or more LDO regulators and two or more driving circuits.

The LDO regulator 3120 may be configured to provide an output voltage (e.g., $V_{OUT}$) to the DC 3130 as a supply voltage. The LDO regulator 3120 may be the same as one of the LDO regulators according to implementations described above. In some implementations, the LDO regulator 3120 may be connected to a high power voltage terminal, and may include at least one high voltage transistor and at least one low voltage transistor, thereby having a relatively wide bandwidth. Accordingly, the LDO regulator 3120 may be connected to the DC 3130, and the DC 3130 may stably receive a voltage from the LDO regulator 3120 even when operating at a high speed.

A pre-defined voltage (for example, the voltage VCON in FIG. 2A) may be applied to the LDO regulator 3120 according to the characteristics of the DC 3130. For example, a pre-defined voltage (for example, the voltage VCON in FIG. 2A) may be applied to the gate terminal of at least one high voltage transistor (for example, the second high voltage transistor HVN0 in FIG. 2A), and based on the predetermined voltage, the voltage of the drain terminal (for example, the first node N1 in FIG. 2A) of at least one low voltage transistor (for example, the first low voltage transistor P1 in FIG. 2A) may be maintained constant.

The DC 3130 may be configured to generate output data from input data, and output the output data via a particular first TSV among a plurality of TSVs formed in the TSV region 3140.

The TSV region 3140 may include a region where the TSV for communicating with the core dies 3200 are formed. In some implementations, the plurality of TSVs formed in the TSV region 3140 may receive output data from the DC 3130, and communicate with the core dies 3200 based on the received output data. When the first through eighth channels CH1 through CH8 have bandwidths of 128 bits, the TSVs may include components for data input/output of 1024 bits.

The HBM PHY region 3150 may include a plurality of input/output circuits for communication with the host device (not illustrated), and for example, the HBM PHY region 3150 may include one or more ports for communication with the host device (not illustrated). The HBM PHY region 3150 may include physical or electrical layers and logical layers provided for signals, frequencies, timings, driving, detailed operation parameters, and functionality, which are required for efficient communication between the host device (not illustrated) and the memory device 3000. The HBM PHY region 3150 may perform memory interfacing, such as selecting rows and columns corresponding to the memory cells, writing data to the memory cells, and reading written data. The HBM PHY region 350 may support characteristics of an HBM protocol of the JEDEC standard.

The SERDES region 3160 may include a region, which provides a SERDES interface of the JEDEC standard, as the processing throughput of the processor(s) of the host device (not illustrated) increases and the requirements for memory bandwidth increases. The SERDES region 3160 may include a SERDES transmitter portion, a SERDES receiver portion, and a controller portion. The SERDES transmitter portion may include a parallel-to-serial circuit and a transmitter, receive a parallel data stream, and serialize the received parallel data stream. The SERDES receiver portion may include a receiver amplifier, an equalizer, a clock, a data restoration circuit, and a serial-to-parallel circuit, receive a serial data stream, and parallelize the received serial data stream. The controller portion may include an error detection circuit, an error correction circuit, a first in first out (FIFO) transistor, etc.

Figure 8A:
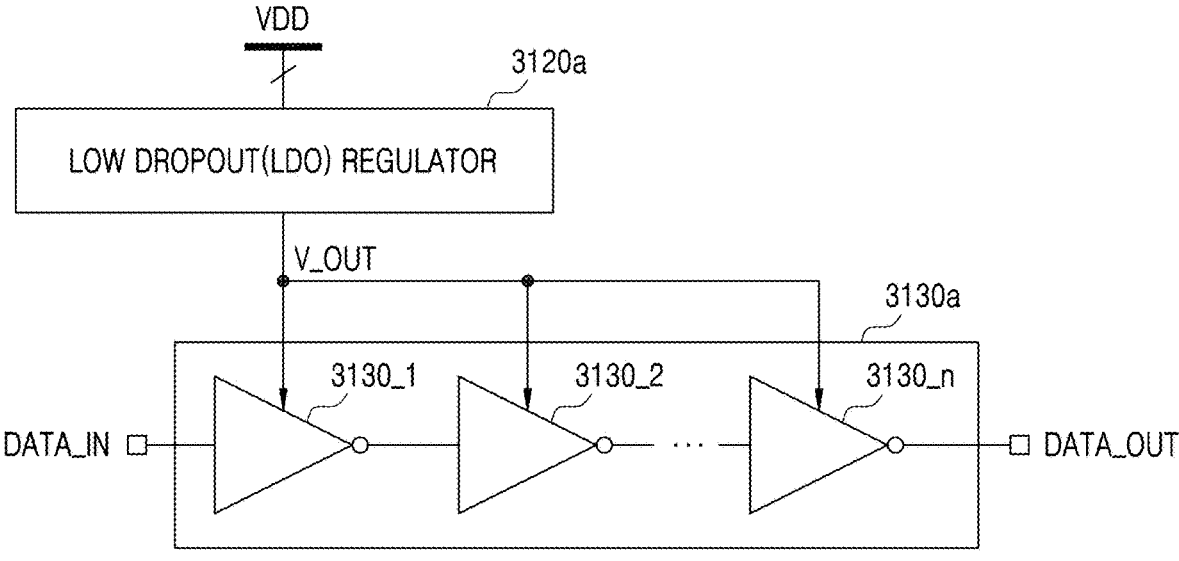
FIGS. 8A and 8B are block diagrams of examples of an LDO regulator and a driving circuit.
Figure 8B:
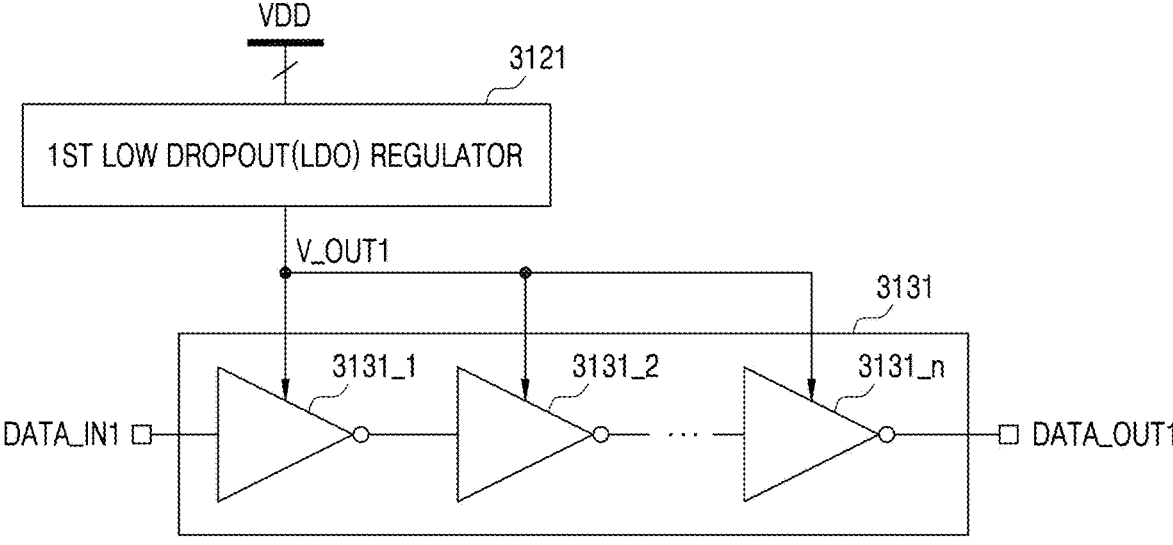
Figure 8B:
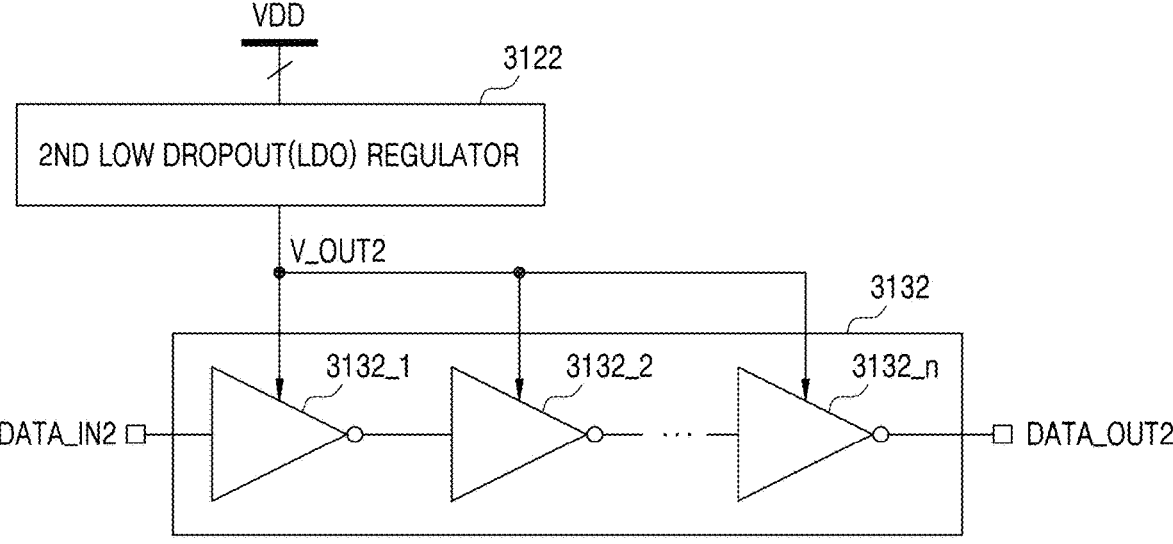

FIGS. 8A and 8B are block diagrams of examples of an LDO regulator 3120a and a driving circuit 3130a in FIG. 7, respectively. Referring to FIG. 8A, the LDO regulator 3120a may be an example of the LDO regulator 3120 in FIG. 7, and thus, duplicate descriptions thereof are omitted.

The driving circuit 3130a may include a plurality of inverters 3130_1 through 3130_n. The driving circuit 3130a may generate output data DATA_OUT by using the plurality of inverters 3130_1 through 3130_n based on input data DATA_IN. The output data DATA_OUT may be transmitted to the first TSV among a plurality of TSVs formed in the TSV region 3140 in FIG. 7.

The LDO regulator 3120a may provide an output voltage V_OUT ($V_{OUT}$ as described with respect to FIGS. 1-5) to the plurality of inverters 3130_1 through 3130_n as a supply voltage, and may include at least one high voltage transistor and at least one low voltage transistor to have a relatively wide bandwidth. Accordingly, the LDO regulator 3120a may supply stable power to the plurality of inverters 3130_1 through 3130_n for operating at a high speed.

The LDO regulator 3120a may receive a pre-defined voltage (for example, the voltage VCON in FIG. 2A) according to the characteristics of the plurality of inverters 3130_1 through 3130_n. For example, a pre-defined voltage (for example, the voltage VCON in FIG. 2A) may be applied to the gate terminal of at least one high voltage transistor (for example, the second high voltage transistor HVN0 in FIG. 2A), and based on the predetermined voltage, the voltage of the drain terminal (for example, the first node N1 in FIG. 2A) of at least one low voltage transistor (for example, the first low voltage transistor P1 in FIG. 2A) may be maintained constant.

Referring further to FIG. 8B, a memory device (for example, the memory device 3000 of FIG. 7) may include first and second LDO regulators 3121 and 3122 and first and second driving circuits 3131 and 3132.

The first driving circuit 3131 may include a plurality of inverters 3131_1 through 3131_n. The first driving circuit 3131 may generate first output data DATA_OUT1 based on first input data DATA_IN1 by using the plurality of inverters 3131_1 through 3131_n. The first output data DATA_OUT1 may be transmitted to a second TSV among the plurality of TSVs formed in the TSV region 3140 in FIG. 7.

The first LDO regulator 3121 may provide a first output voltage V_OUT1 to the plurality of inverters 3131_1 through 3131_*n* as a supply voltage, and may include at least one high voltage transistor and at least one low voltage transistor to have a relatively wide bandwidth. Accordingly, stable power may be supplied so that the plurality of inverters 3131_1 through 3131_*n* operate at a high speed. The first LDO regulator 3121 can have characteristics as described for the LDO regulators discussed above, e.g., LDO regulators 10, 10*a*, 10*b*, 10*c*, 10*d*.

The second driving circuit 3132 may include a plurality of inverters 3132_1 through 3132_*n*. The second driving circuit 3132 may generate second output data DATA_OUT2 based on second input data DATA_IN2 by using the plurality of inverters 3130_1 through 3130_*n*. The second output data DATA_OUT2 may be transmitted to a third TSV among the plurality of TSVs formed in the TSV region 3140 in FIG. 7.

The second LDO regulator 3122 may provide a second output voltage V_OUT2 to the plurality of inverters 3132_1 through 3132_*n* as a supply voltage, and may include at least one high voltage transistor and at least one low voltage transistor to have a relatively wide bandwidth. Accordingly, stable power may be supplied so that the plurality of inverters 3132_1 through 3132_*n* operate at a high speed. The second LDO regulator 3122 can have characteristics as described for the LDO regulators discussed above, e.g., LDO regulators 10, 10*a*, 10*b*, 10*c*, 10*d*.

The first LDO regulator 3121 may receive a pre-defined first voltage according to the characteristics of the plurality of inverters 3131_1 through 3131_*n*. The second LDO regulator 3122 may receive a pre-defined second voltage according to the characteristics of the plurality of inverters 3132_1 through 3132_*n*. For example, when characteristics of the plurality of inverters 3131_1 through 3131_*n* are different from characteristics of the plurality of inverters 3132_1 through 3132_*n*, the first voltage may be defined different from the second voltage. For example, when characteristics of the plurality of inverters 3131_1 through 3131_*n* are the same as characteristics of the plurality of inverters 3132_1 through 3132_*n*, the first voltage may be defined the same as the second voltage.

Figure 9:
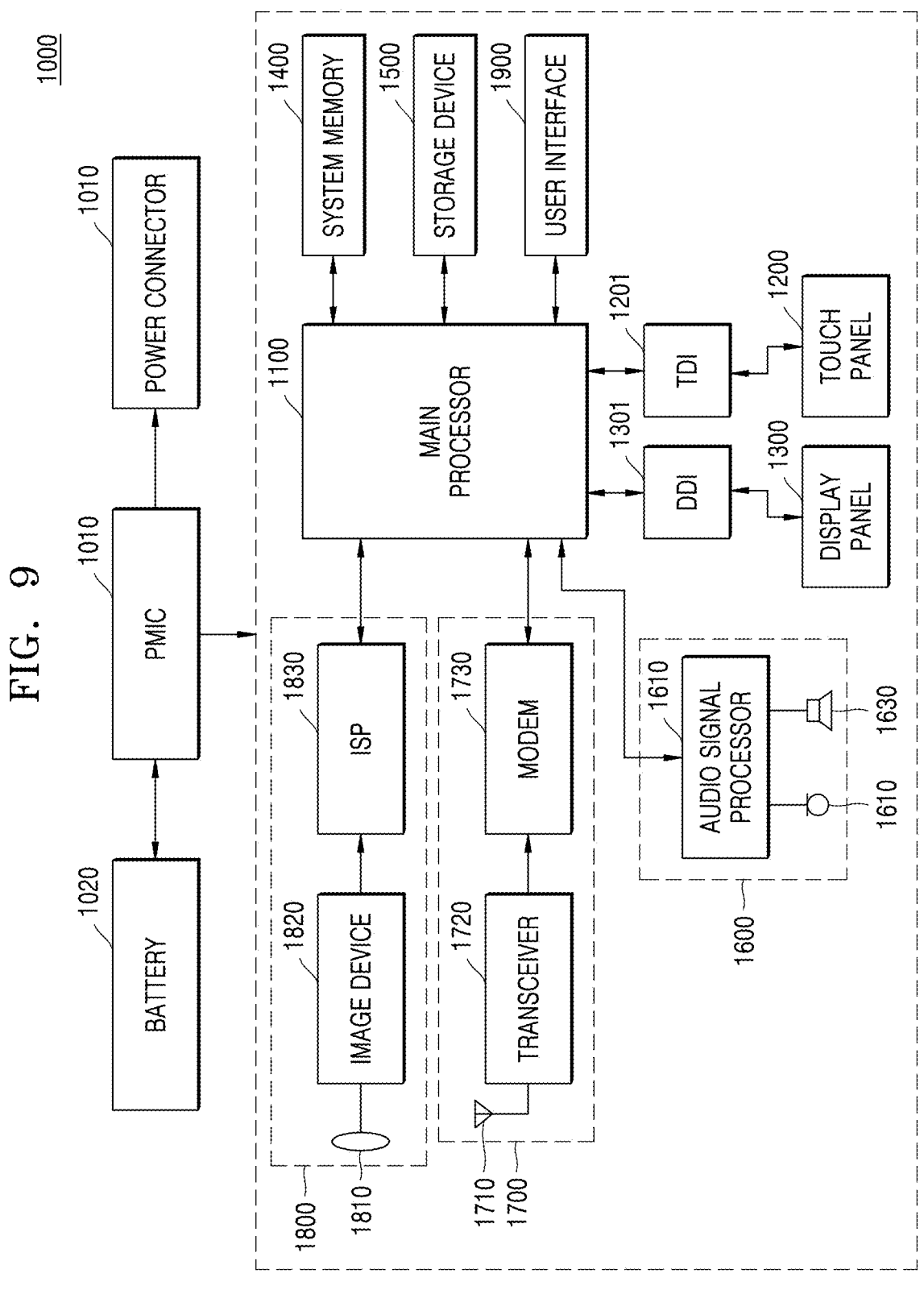
FIG. 9 is a block diagram of an electronic device according to some implementations.

FIG. 9 is a block diagram of an electronic device 1000 according to some implementations.

Referring to FIG. 9, the electronic device 1000 may include a main processor 1100, a touch panel 1200, a touch driver circuit (TDI) 1201, a display panel 1300, a display driving circuit (DDI) 1301, a system memory 1400, a storage device 1500, an audio processor 1600, a communication block 1700, an image processor 1800, and a user interface 1900. In various implementations, the electronic device 1000 may include one of various electronic devices, such as a personal computer, a laptop computer, a server, a workstation, a mobile communication terminal, a PDA, a PMP, a digital camera, a smartphone, a tablet computer, and a wearable device.

The main processor 1100 may control the overall operation of the electronic device 1000. The main processor 1100 may control/manage operations of components of the electronic device 1000. The main processor 1100 may perform various operations for driving the electronic device 1000. The touch panel 1200 may be configured to sense a touch input from a user under control by a touch driving circuit 1201. The display panel 1300 may be configured to display image information according to a control of a display driving circuit 1301.

The system memory 1400 may store data used for an operation of the electronic device 1000. For example, the system memory 1400 may include a volatile memory, such as static RAM (SRAM), DRAM, and SDRAM, and/or a non-volatile memory, such as phase change RAM (PRAM), magneto-resistive RAM (MRAM), resistive RAM (ReRAM), and ferro-electric RAM (FRAM).

The storage device 1500 may store data regardless of power supply. For example, the storage device 1500 may include at least one of various non-volatile memories, such as flash memory, PRAM, MRAM, ReRAM, and FRAM. For example, the storage device 1500 may include an internal memory and/or a removable memory of the electronic device 1000.

The audio processor 1600 may process an audio signal by using an audio signal processor 1610. The audio processor 1600 may receive an audio input via a microphone 1620, or provide an audio output via a speaker 1630.

The communication block 1700 may exchange signals with an external device/system via an antenna 1710. A transceiver 1720 and a modulator/demodulator (modem) 1730 of the communication block 1700 may process signals exchanged with the external device/system, according to at least one of various wireless communication protocols, such as long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive light via a lens 1810. The image device 1820 and an image signal processor (ISP) 1830 included in the image processor 1800 may generate image information about an external object based on the received light. The user interface 1900 may include interface capable of exchanging information with a user, except for the touch panel 1200, the display panel 1300, the audio processor 1600, and the image processor 1800. The user interface 1900 may include a keyboard, a mouse, a printer, a projector, various sensors, human body communication device, etc.

The electronic device 1000 may further include a power management integrated circuit (PMIC) 1010, a battery 1020, and a power source connector 1030. The PMIC 1010 may generate an internal power from power source supplied by the battery 1020 or power source supplied by the power source connector 1030, and may provide the internal power source to the main processor 1100, the touch panel 1200, the TDI 1201, the display panel 1300, the DDI 1301, the system memory 1400, the storage device 1500, the audio processor 1600, the communication block 1700, the image processor 1800, and the user interface 1900.

The electronic device 1000 may include one or more LDO regulators according to some implementations. The LDO regulators may be connected to the high power voltage terminal, may include at least one high voltage transistor and at least one low voltage transistor, and may be connected to components included in the electronic device 1000 to supply power to components included in the electronic device 1000 via at least one low voltage transistor. Accordingly, the LDO regulators may have relatively wide bandwidths, and components included in the electronic device 1000 may stably receive power from the LDO regulators.

The PMIC 1010 may perform a dynamic voltage scaling (DVS) operation on semiconductor integrated circuits. The PMIC 1010 may provide power voltages to the LDO regulators, and the power voltages may be high power voltages corresponding to relatively high voltage levels.

In some implementations, the electronic device 1000 may be implemented as various mobile devices, such as a smartphone and a smart pad. In addition, the electronic device 1000 may be implemented as various wearable devices, such as a smart watch, a smart glass, and a virtual reality goggle.

In the examples described above, constituent components have been described by using terms, such as first, second, and third. However, the terms, such as first, second, and third may be used to different the constituent components from each other, and may not limit the scope of this disclosure. For example, the terms, such as first, second, and third may not connote a sequence or numerical meaning of an arbitrary type. In the examples described above, the constituent components have been referred to by using blocks. The blocks may be implemented as various hardware devices, such as an integrated circuit (IC), an application specific IC (ASIC), a field programmable gate array (FPGA), and a complex programmable logic device (CPLD), firmware driven in hardware devices, software such as an application, or a combination of hardware devices and software. In addition, the blocks may include circuits including semiconductor devices in the IC or circuits registered as intellectual property (IP).

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While various examples have been particularly shown and described, it will be understood that various changes in form and details may be made therein without departing from the spirit and scope of the following claims.

What is claimed is:

1. A low dropout (LDO) regulator comprising:
a first low voltage transistor comprising:
   a first terminal connected to an output node, the output node being configured to provide an output voltage to a load, and
   a second terminal connected to a first node;
an operational amplifier configured to (i) compare a reference voltage with the output voltage to obtain a comparison result, and (ii) output the comparison result to a gate terminal of the first low voltage transistor; and
an operation biasing control circuit connected to the output node and the first node and including at least one high voltage transistor,
   wherein the operation biasing control circuit is configured to control a bias on the first low voltage transistor based on a pre-defined voltage.

2. The LDO regulator of claim 1, wherein the operation biasing control circuit is configured to receive a high power voltage from a high power voltage terminal, and
   wherein the first low voltage transistor is configured to output the output voltage based on the high power voltage.

3. The LDO regulator of claim 2, wherein the at least one high voltage transistor comprises:
   a first high voltage transistor comprising a first terminal connected to the high power voltage terminal and a second terminal connected to the output node; and a second high voltage transistor comprising a first terminal connected to a gate terminal of the first high voltage transistor and a second terminal connected to the first node.

4. The LDO regulator of claim 3, wherein:
the second high voltage transistor has a first channel type,
the first high voltage transistor has a second channel type that is different from the first channel type, and
the first low voltage transistor has the second channel type.

5. The LDO regulator of claim 3, wherein:
the gate terminal of the second high voltage transistor is configured to receive the pre-defined voltage, and
the pre-defined voltage results in the output voltage being compatible with the load.

6. The LDO regulator of claim 3, further comprising:
a first switch configured to selectively connect the high power voltage terminal to the gate terminal of the first high voltage transistor; and
a second switch configured to selectively connect the gate terminal of the second high voltage transistor to ground.

7. The LDO regulator of claim 1, wherein the at least one high voltage transistor comprises:
a first high voltage transistor comprising a first terminal connected to a high power voltage terminal and a second terminal connected to the output node;
a second high voltage transistor comprising a first terminal connected to a gate terminal of the first high voltage transistor and a second terminal connected to the first node; and
a third high voltage transistor comprising a first terminal connected to the high power voltage terminal, a second terminal connected to the second terminal of the second high voltage transistor, and a gate terminal connected to the gate terminal of the first high voltage transistor.

8. The LDO regulator of claim 7, wherein:
the second high voltage transistor has a first channel type,
the first low voltage transistor has a second channel type that is different from the first channel type, and
the first high voltage transistor and the third high voltage transistor have the second channel type.

9. The LDO regulator of claim 7, further comprising:
a fourth high voltage transistor comprising a first terminal connected to the high power voltage terminal and a gate terminal connected to the second terminal of the third high voltage transistor;
a fifth high voltage transistor comprising a first terminal connected to a second terminal of the fourth high voltage transistor;
a second low voltage transistor comprising a first terminal connected to the first node and a second terminal connected to ground; and
a third low voltage transistor comprising a first terminal connected to a second terminal of the fifth high voltage transistor, a second terminal connected to ground, and a gate terminal connected to a gate terminal of the second low voltage transistor.

10. The LDO regulator of claim 1, wherein the operation biasing control circuit is configured to maintain a voltage between the gate terminal of the first low voltage transistor and the second terminal of the first low voltage transistor at a constant level.

11. The LDO regulator of claim 1, wherein the operation biasing control circuit is configured to maintain a voltage of the first node less than a threshold voltage.

12. A low dropout (LDO) regulator comprising:
a first low voltage transistor comprising:
    a first terminal connected to an output node, the output node being configured to provide an output voltage to a load, and
    a second terminal connected to a first node;
an operational amplifier configured to (i) compare a reference voltage with the output voltage to obtain a comparison result, and (ii) output the comparison result to a gate terminal of the first low voltage transistor;
a first high voltage transistor comprising a first terminal connected to a high power voltage terminal and a second terminal connected to the output node; and
a second high voltage transistor comprising a first terminal connected to a gate terminal of the first high voltage transistor and a second terminal connected to the first node,
wherein the second high voltage transistor has a different channel type than the first high voltage transistor and the first low voltage transistor.

13. The LDO regulator of claim 12, further comprising:
a first switch configured to selectively connect the high power voltage terminal to the gate terminal of the first high voltage transistor; and
a second switch configured to selectively connect the gate terminal of the second high voltage transistor to ground.

14. The LDO regulator of claim 12, further comprising:
a third high voltage transistor comprising a first terminal connected to the high power voltage terminal, a second terminal connected to the second terminal of the second high voltage transistor, and a gate terminal connected to the gate terminal of the first high voltage transistor.

15. The LDO regulator of claim 14, wherein the third high voltage transistor has a different channel type than the second high voltage transistor.

16. The LDO regulator of claim 14, further comprising:
a second low voltage transistor comprising a first terminal connected to the first node and a second terminal connected to ground;
a fourth high voltage transistor comprising a first terminal connected to the high power voltage terminal and a gate terminal connected to the second terminal of the third high voltage transistor;
a fifth high voltage transistor comprising a first terminal connected to a second terminal of the fourth high voltage transistor; and
a third low voltage transistor comprising a first terminal connected to a second terminal of the fifth high voltage transistor, a second terminal connected to ground, and a gate terminal thereof is connected to a gate terminal of the second low voltage transistor.

17. A memory device comprising:
a buffer die; and
a plurality of core dies vertically stacked on the buffer die and connected to the buffer die via a plurality of through silicon vias (TSV),
wherein the buffer die comprises:
    a first driving circuit configured to generate first output data from first input data and output the generated first output data to a first TSV of the plurality of TSVs; and
    a first low dropout (LDO) regulator configured to provide a first output voltage of a first output node to the first driving circuit as a first supply voltage, wherein the first LDO regulator comprises:
    a first low voltage transistor comprising a first terminal connected to the first output node and a second terminal connected to a first node;
    a first operational amplifier configured to (i) compare a first reference voltage with the first output voltage to obtain a first comparison result, and (ii) output the first comparison result to a gate terminal of the first low voltage transistor; and
    a first operation biasing control circuit connected to the first output node and the first node and including at least one first high voltage transistor,
wherein the first operation biasing control circuit is configured to control a bias on the first low voltage transistor based on a pre-defined first voltage.

18. The memory device of claim 17, wherein the buffer die further comprises:
a second driving circuit configured to generate second output data from second input data and output the generated second output data to a second TSV of the plurality of TSVs; and
a second LDO regulator configured to provide a second output voltage of a second output node to the second driving circuit as a second supply voltage,
wherein the second LDO regulator comprises:
a second low voltage transistor comprising a first terminal connected to the second output node and a second terminal connected to a second node;
a second operational amplifier configured to compare a second reference voltage with the second output voltage to obtain a second comparison result, and output the second comparison result to a gate terminal of the second low voltage transistor; and
a second operation biasing control circuit connected to the second output node and the second node and including at least one second high voltage transistor,
wherein the second operation biasing control circuit is configured to control a bias on the second low voltage transistor based on a pre-defined second voltage.

19. The memory device of claim 18, wherein:
the pre-defined first voltage results in the first output voltage being compatible with the first driving circuit, and
the pre-defined second voltage results in the second output voltage being compatible with the second driving circuit.

20. The memory device of claim 17, wherein the at least one first high voltage transistor comprises:
a first high voltage transistor comprising a first terminal connected to a high power voltage terminal and a second terminal connected to the first output node;
a second high voltage transistor comprising a first terminal connected to a gate terminal of the first high voltage transistor and a second terminal connected to the first node; and
a third high voltage transistor comprising a first terminal connected to the high power voltage terminal, a second terminal connected to the second terminal of the second high voltage transistor, and a gate terminal connected to the gate terminal of the first high voltage transistor,
wherein the second high voltage transistor has a different channel type than the first low voltage transistor, the first high voltage transistor, and the third high voltage transistor.

* * * * *